(12) United States Patent
Norton

(10) Patent No.: US 6,225,922 B1
(45) Date of Patent: May 1, 2001

(54) SYSTEM AND METHOD FOR COMPRESSING DATA USING ADAPTIVE FIELD ENCODING

(75) Inventor: Kirkpatrick W. Norton, San Diego, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/039,929

(22) Filed: Mar. 16, 1998

(51) Int. Cl.[7] .................................................. H03M 7/30
(52) U.S. Cl. .............................................. 341/87; 341/51
(58) Field of Search .................... 341/50, 51, 87

(56) References Cited

U.S. PATENT DOCUMENTS

| | | | |
|---|---|---|---|
| 5,123,061 | * 6/1992 | Pritchard | 382/56 |
| 5,153,591 | * 10/1992 | Clark | 341/51 |
| 5,455,577 | * 10/1995 | Slivka et al. | 341/51 |
| 5,463,389 | * 10/1995 | Klayman | 341/51 |
| 5,488,717 | * 1/1996 | Gibson et al. | 395/600 |
| 5,608,396 | * 3/1997 | Cheng et al. | 341/50 |
| 5,825,830 | * 10/1998 | Kopf | 375/340 |

* cited by examiner

*Primary Examiner*—Peguy JeanPierre

(57) ABSTRACT

A data compression system and method for compressing data of an input data stream having field widths for holding data values of a data set. Each field width is represented by a field value. The data compression system includes an adaptive processor having an encode module for encoding the input signal and dynamically changing the field widths at various positions in the data stream. This minimizes a storage space required to represent the entire data set. A decode module can be included for decoding the compressed format and producing an output signal having a lossless representation of the input signal.

31 Claims, 8 Drawing Sheets

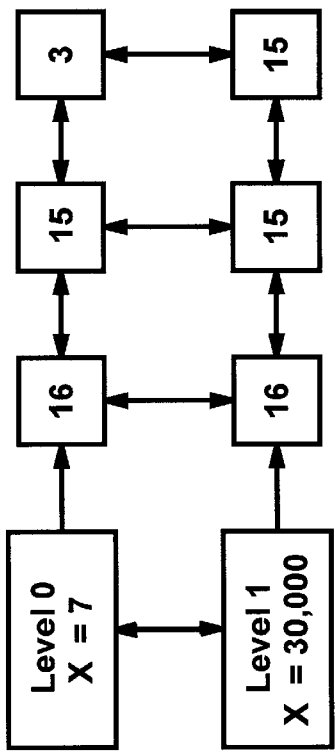
FIG. 6C
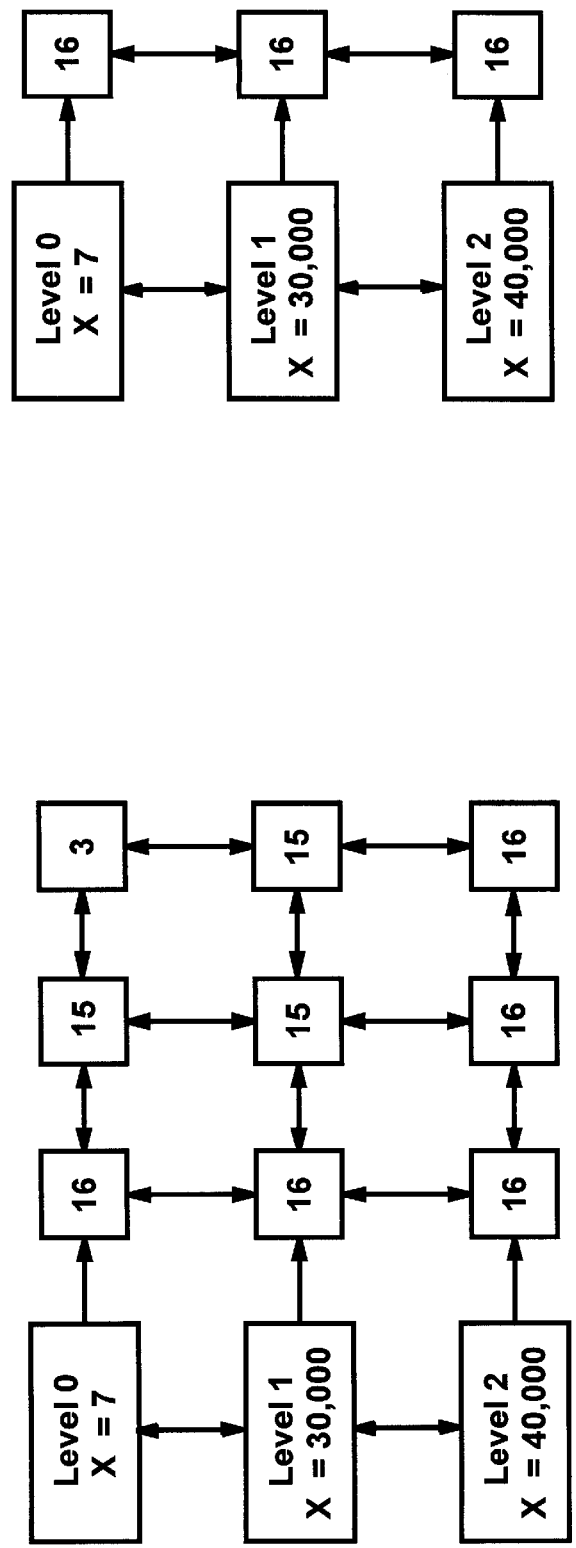
FIG. 7B
FIG. 7A

SYSTEM AND METHOD FOR COMPRESSING DATA USING ADAPTIVE FIELD ENCODING

BACKGROUND OF THE INVENTION

1. Field of the Invention

The present invention relates in general to data compression systems and in particular to a data compression system and method for dynamically encoding data into a compressed format and decoding the compressed format without the use of stored or referenced symbol tables or encoding trees for increased efficiency for some data sets.

2. Related Art

Data comprised of text, sounds, images, and video can be encoded so that fewer bits are used to store, transmit, or process the data more efficiently. After the encoded data is stored, transmitted, or processed, the encoded data is decoded to obtain the original data. Encoded data can save storage space of a particular storage medium or can reduce the time it takes to transmit data from one location to another. Thus, current data encoding systems and methods are very important, useful and popular.

As a result, many different data encoding systems and methods exist. This is because the efficiency of any data compression scheme is dependent on the data that is being compressed. One basic type of data encoding system that is used as a basis for many data compression systems is Huffman coding. Huffman coding is a data compression technique that varies the length of the encoded symbol in proportion to its information content. In other words, when a symbol or token is used frequently, a relatively short binary string is used to represent the symbol or token in a compressed stream. Huffman codes can be properly decoded because they obey the prefix property, which means that no code can be a prefix of another code, and so the complete set of codes can be represented as a binary tree, known as a Huffman tree. Each leaf of the Huffman tree corresponds to a letter. The goal is to build a tree with the minimum external path weight. Huffman coding requires a stored or referenced encoding a tree symbol for proper decoding.

Run-length encoding is another basic encoding system. Run-length encoding involves replacing strings of repeated characters, or other units of data, with a single character and a count. For example, a recurring sequence of numbers is first identified and then that sequence is represented with a single number. As a result, run-length encoding can only efficiently compress data that is repetitive. For text files, a similar technique is key-word encoding. Key-word encoding involves replacing frequently occurring words with a 2-byte token. This replacement saves one or more bytes of storage for every instance of that word in a text file. Key-word encoding also requires a stored or referenced symbol table for proper decoding.

Another compression system that is frequently used to compress image data is the Lempel-Ziv Welch (LZW) compression system. LZW compression relies on the reoccurrence of byte sequences or strings in its input. A table mapping input strings to their associated output codes is maintained. Mappings for all possible strings of length one are initially contained in the table. Input is taken one byte at a time in order to determine the longest initial string present in the table. The code for the longest initial string is first output, and then the string is extended with one more input byte.

Next, a new entry is added to the table mapping the extended string to the next unused code and can be obtained by incrementing a counter. The process is repeated, starting from the input byte. The number of bits in an output code (the maximum number of entries in the table) is typically fixed, and once this limit is reached, no more entries are added. Decompression can be accomplished by receiving the compressed code signals and generating a string table similar to that constructed during compression to produce a lookup table of received code signals. This enables recovery of the data character signals comprising a stored string. Thus, a stored or referenced symbol table is required for proper decoding.

From the foregoing it will be apparent that there is a need to encode data dynamically and to decode the encoded data without the use of stored or referenced symbol tables or encoding trees for increased efficiency for some data sets. Therefore, what is needed is a system and method to realize adaptive field encoding and decoding of data.

Whatever the merits of the above mentioned systems and methods, they do not achieve the benefits of the present invention.

SUMMARY OF THE INVENTION

To overcome the limitations in the prior art described above, and to overcome other limitations that will become apparent upon reading and understanding the present specification, the present invention, in a preferred embodiment, provides a data compression system that encodes data dynamically and decodes the data without the use of stored or referenced symbol tables or encoding trees. A data compression system and method embodying the invention compresses data efficiently for some data sets and utilizes a simple scheme for decompressing the data.

The data compression system of the preferred embodiment compresses data of an input data stream having field widths for holding data values of a data set. The term "field width" specifically refers to the space required to store information. Each field width is represented by a field value, such as a bit size if the binary base storage system is used. Although the term "bit" is used as a field value throughout the specification, any suitable base storage system could be used. The data compression system includes an adaptive processor having an encode module for encoding the input signal and dynamically changing the field widths at various positions in the data stream. This minimizes a storage space required to represent the entire data set. Also, a decode module can be included in the system for decoding the compressed format and producing an output signal having a lossless representation of the input signal.

The foregoing and still further features and advantages of the present invention as well as a more complete understanding thereof will be made apparent from a study of the following detailed description of the invention in connection with the accompanying drawings and appended claims.

BRIEF DESCRIPTION OF THE DRAWINGS

Referring now to the drawings in which like reference numbers represent corresponding parts throughout:

FIG. 6C is a detailed block diagram illustrating node removal of the decision tree of the of the sample of FIG. 6B;

FIG. 7A is a detailed block diagram illustrating a third decision insertion into a decision tree of the sample of FIG. 6A; and FIG. 7B is a detailed block diagram of node removal and partially resolved components of the sample of FIG. 7A.

DETAILED DESCRIPTION OF THE PREFERRED EMBODIMENT

Figure 1A:
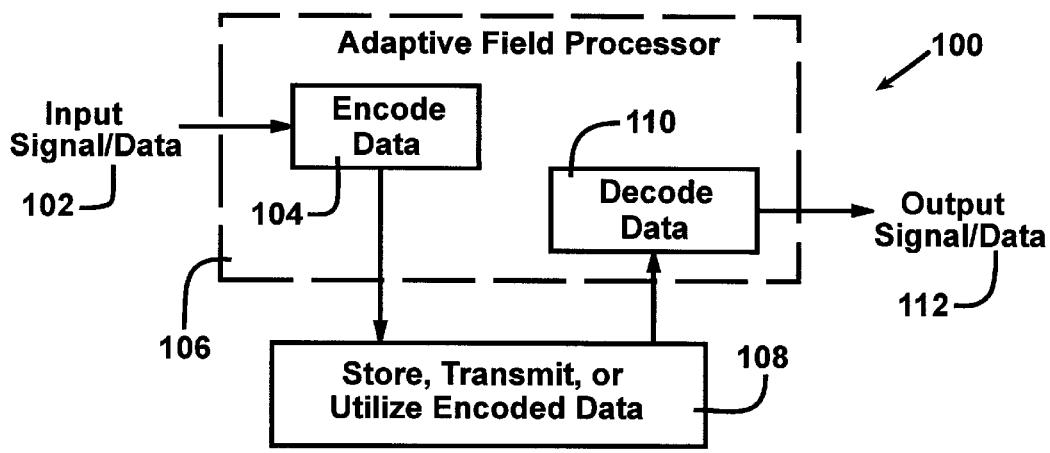
FIG. 1A is a structural/functional overview block diagram of the present invention.

In the following description of the preferred embodiment, reference is made to the accompanying drawings which, form a part hereof, and in which is shown by way of illustration a specific embodiment in which the invention may be practiced. It is to be understood that other embodiments may be utilized and structural changes may be made without departing from the scope of the present invention.
Introduction:

As shown in the drawings for the purposes of illustration, the invention is embodied in a novel data compression system and method. A system and method according to the invention provides dynamic encoding of input data to produce compressed data. The present invention also provides decoding of the compressed data without the use of a stored or referenced symbol table or an encoding tree to efficiently decompress data for some data sets. Existing data compression systems and methods have failed to provide dynamic and efficient data compression in combination with a simple decompression system without using stored or referenced symbol tables or encoding trees when decoding the data.

A data compression system according to the invention includes an adaptive processor having an encode processor or module and a decode processor or module. The encode processor receives an input signal or an input data stream. The input data stream has field widths for holding data values of a data set. Each field width is represented by a field value, such as a bit size if the binary base storage system is used. A total original bit size corresponds to a sum of the bit sizes. An optimizer submodule of the encode module dynamically encodes the input data stream into a compressed format by optimally changing the field widths at various points in the data stream. The compressed format is represented by a second bit size that is an optimal representation of the total original bit size.

Specifically, the optimizer submodule dynamically minimizes the number of bits required to represent the entire data set of the input data stream. This optimizes the bit representation of the input data stream. The decode module decodes the compressed format and completely recovers the entire input signal as an output signal having a lossless representation of the input signal. This data compression system efficiently compresses data dynamically for some data sets and decompresses the compressed data without the use of inefficient stored or referenced symbol tables or encoding trees.
Structural/Functional Overview:

Referring now to the drawings and more particularly to FIG. 1A, there is shown a structural/functional overview of a data compaction system 100, which is constructed in accordance with the present invention. The system 100 enables an input signal 102 in the form of data, such as digital data, to be encoded and compressed, intermediately stored, transmitted, or processed, and then decoded and decompressed when desired. The input signal 102 has field widths for holding data values of a data set. The field widths are represented by a total original bit size.

First, the input signal 102 is encoded 104 with an adaptive field encoder/decoder 106 into a compressed and optimized format having a second bit size that is an optimal representation of the total original bit size. The total original bit size of the input signal 104 is dynamically optimized by minimizing the number of bits required to represent the entire data set of the input signal.

Second, the compressed format of the data is stored, transmitted or utilized 108 by an intermediate device. For example, the intermediate device can be a hard drive of a computer utilizing the compressed format of the data for conserving storage space. Another intermediate device can be a communication line utilizing the compressed format of the data for reducing transmission time of the data.

Third, the compressed format of the data is decoded 110 with the adaptive field encoder/decoder 106 into an uncompressed format. The uncompressed format is represented by an output signal 112 having a lossless representation of the input signal 102, i.e., the entire input signal 102 is completely recovered and none of the signal is lost.

Figure 1B:
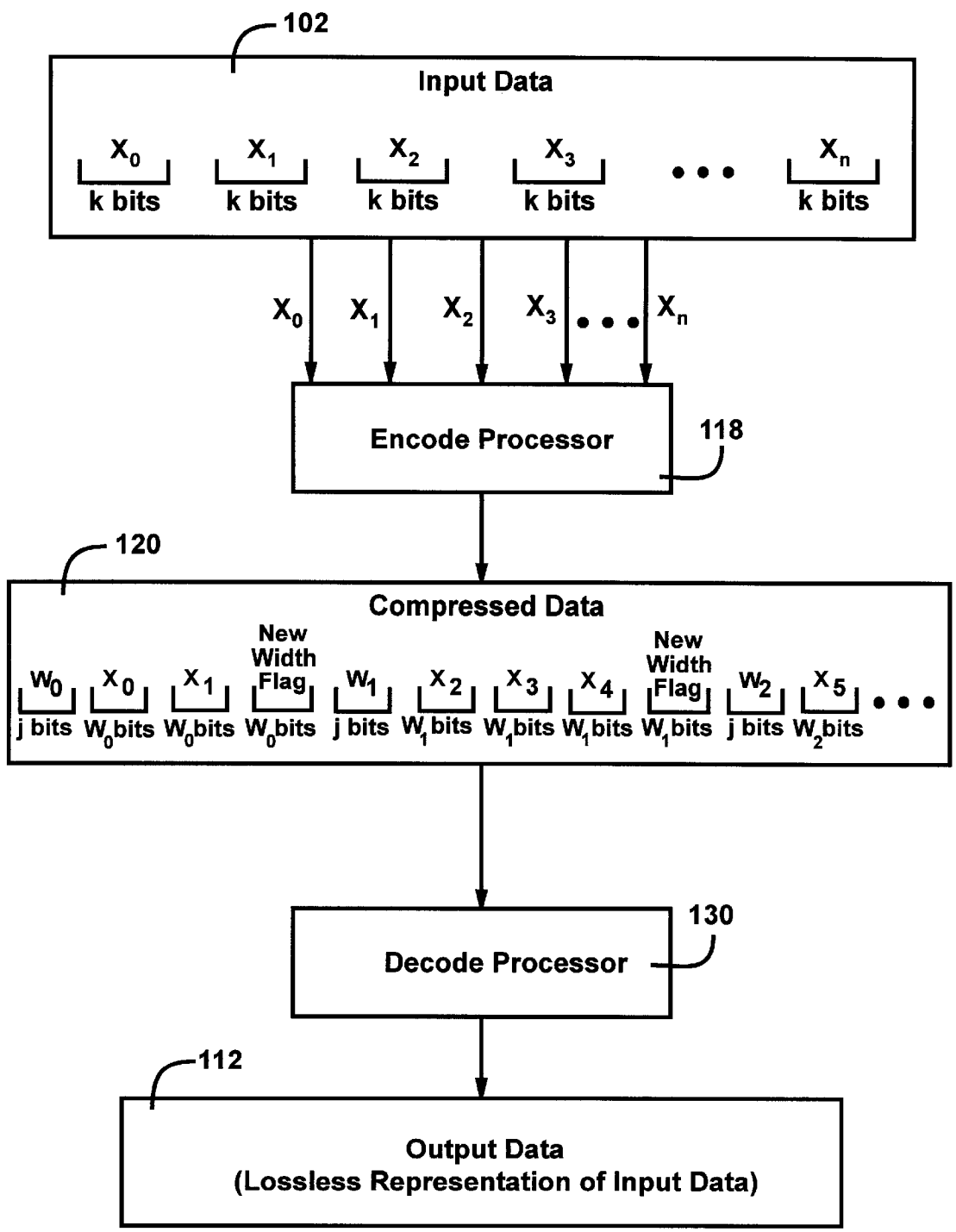
FIG. 1B is a graphical overview block diagram of the present invention.

FIG. 1B is a graphical overview block diagram of the present invention. The original input data 102 can be of many forms, such as a data set represented by a number of bits. In such an example, the original input is comprised of a plurality of data values ($X_0$, $X_1$, $X_2$, $X_3$, ... $X_n$), each occupying a k bit wide field. The size of the k bit wide field would be dependent on the input data 102. The values are represented by a total number of bits. For instance, if k=8 bits, and there are 10 data values in the original input data 102 (i.e. n=10), then there will be a total of 80 bits representing those 8 values in the original input data representation.

An encode processor or encode module 118 of the adaptive field processor 106 of FIG. 1A receives the data set as a data stream, reads the plurality of data values $X_0$, $X_1$, $X_2$, $X_3$, ... $X_n$ sequentially and encodes the original data (details of the encoding process is discussed in detail below) to produce compressed data 120. The compressed data 120 is comprised of the data values, new width flags, and field width information ($W_0$, $W_1$, $W_2$, ...) occupying a fixed field length of j bits. Although a fixed field width is used, it is described for illustrative purposes only and any suitable arrangement can be utilized to store the field width information. Each data value ($X_0$, $X_1$, $X_2$, $X_3$, ... $X_n$) occupies fields of these widths ($W_0$, $W_1$, $W_2$, ...), as shown in FIG. 1A. The new width flags indicate field width changes. Placement of the new width flags is dynamically determined in accordance with the present invention to produce an optimal representation of the data set in terms of the number of bits used. Thus, the placement of the new width flags shown in FIG. 1B is for illustrative purposes only.

Each new width flag indicates that the following field will contain data field width information and should therefore be interpreted as an unsigned j bit value (negative field widths do not exist). All data values are represented in fields with widths equal to the last field width specified (i.e. $X_0$ and $X_1$ is represented by a field width of $W_0$, $X_2$, $X_3$ and $X_4$ is represented by a field width of $W_1$, and $X_5$, is represented by a field width of $W_2$, . . . ). The field width used to represent data values is optimally changed at various points in the data stream to minimize the number of bits required to represent the entire data set (details of the encoding process is discussed in detail below).

In addition, there could also be header information preceding the data stream of FIG. 1B, but not all input data will have header information. If a header was present, it could contain information such as the maximum data field width allowed, the field width of the first data value, the number of data threads present in the stream (for threaded data), or a flag indicating whether or not the data values are signed. Although this type of information could be attached to the data stream as a header, this information is not necessary if the decode processor or module 130 already has this information via for example, a predefined standard maximum field width. It should be noted that there are no constraints imposed on, among other things the encoded format, such as header information, maximum field widths for data or width information, the precise format the new width flag, etc.

Figure 2:
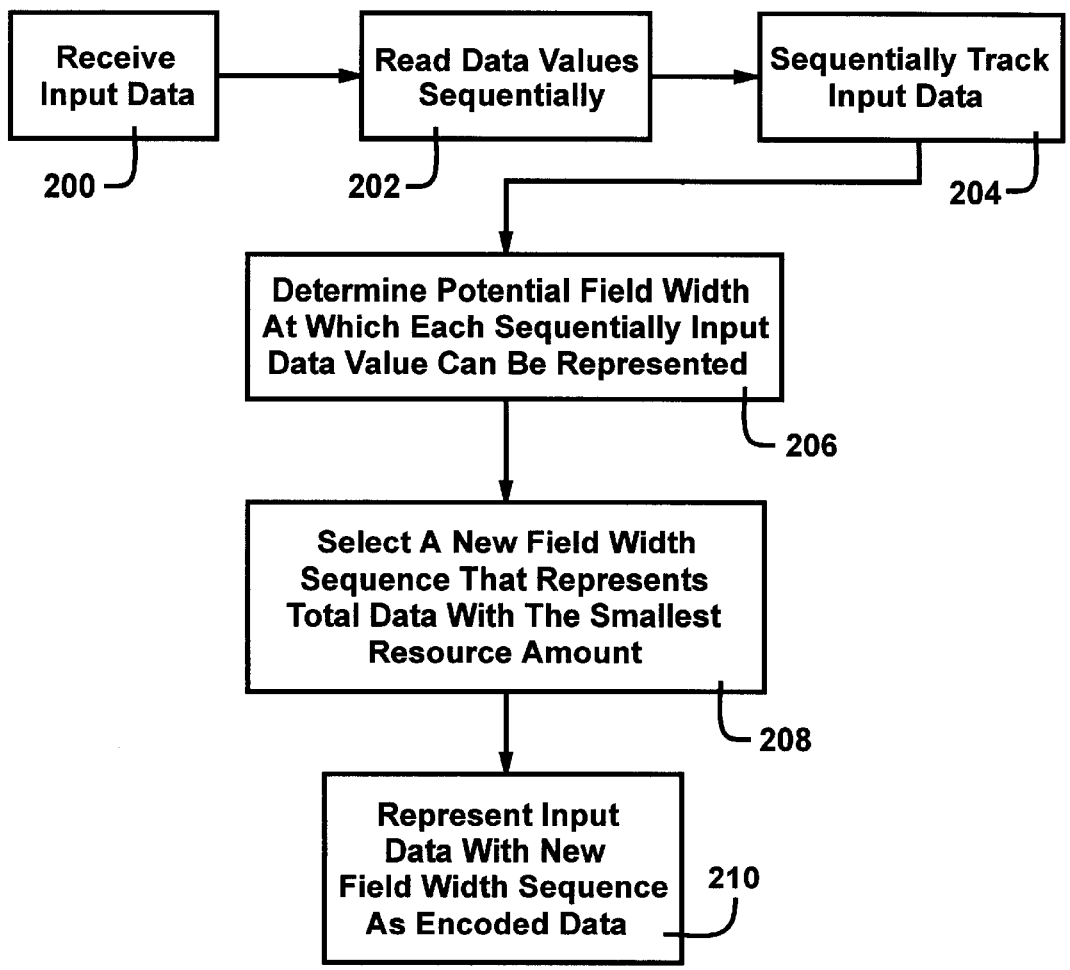
FIG. 2 is a flow diagram illustrating general operation of the encode processor of FIG. 1A.

Exemplary Encode Module:

FIG. 2 is a flow diagram illustrating general operation of an exemplary encode processor of FIGS. 1A and 1B. The encode module is for illustrative purposes and any suitable encode module, in accordance with the present invention, can be used. The encode module of the adaptive field processor 106 of FIG. 1A determines potential field widths of sequentially received data. From this, field width sequences are selected that optimally represent a total set of the data. In other words, the number of bits required to represent the total set of data is dynamically minimized by removing unused high order bits to efficiently encode the data for some data sets. Moreover, low frequency original data could be preconditioned with a delta prefilter. This would result in each data value of the original data having a small magnitude, and therefore, the data would compress more efficiently.

Specifically, as shown in FIG. 2, first, an input signal representing digital data is received 200. Second, values of the digital data are read sequentially 202. Third, the data is sequentially tracked 204. Fourth, the encode module determines potential field widths at which each sequentially received data value can be represented 206. Fifth, a new field width sequence that represents the total data with the smallest resource amount is selected 208. Next, the input data is represented with a new field width sequence as encoded and compressed data 210.

Further, as discussed above in FIG. 1B, the encode module flags changes in the field width. Because some extra bits must be used to flag changes in the field width, there is some overhead involved whenever there is a new field width. Although any suitable flag can be used to represent this change, for illustrative purposes only, a bit field of all ones (at the current field width) can be used to signify a change in the field width and subsequent fixed bit field widths are used to specify the new field width. The fixed bit field widths represent the maximum field width. Although a fixed field width is used, it is described for illustrative purposes only and any suitable arrangement can be utilized. For fixed bit field widths, for a data set with a maximum field width of 16 bits, fixed 4 bit field widths are used because it takes 4 bits to represent the value 16.

As an example, for a data set with a maximum field width of 16 bits, if values are being represented at a field width of 3 bits, but the encode module changes the field width to 5 bits, there will a total of 7 added bits required to make the change. The current field width of 3 bits is added to 4 bits, which indicates a change in resolution as well as the new resolution value: e.g., "111" flags a field width change, and "0100" indicates that 5 bits is the new field width, and not 4. Any suitable pattern could be used to represent the data values and the field widths, and thus, the above example is for illustrative purposes only.

Therefore, the number of bits associated with a field width change is the current number of bits of the field width plus the number of bits used to represent the field width values. This overhead is added into a total bit count of a node if its parent node has a different field width and can be expressed as:

$$N_{bits-overhead} = \text{FIELD WIDTH}_{Parent} + \text{FIELD WIDTH}_{Field\ Width}$$

Since the field width will never be zero bits, the encoding specifies the field width minus one (i.e., a field width field of "1101" indicates a field width of 14 bits, not 13).

Figure 3:
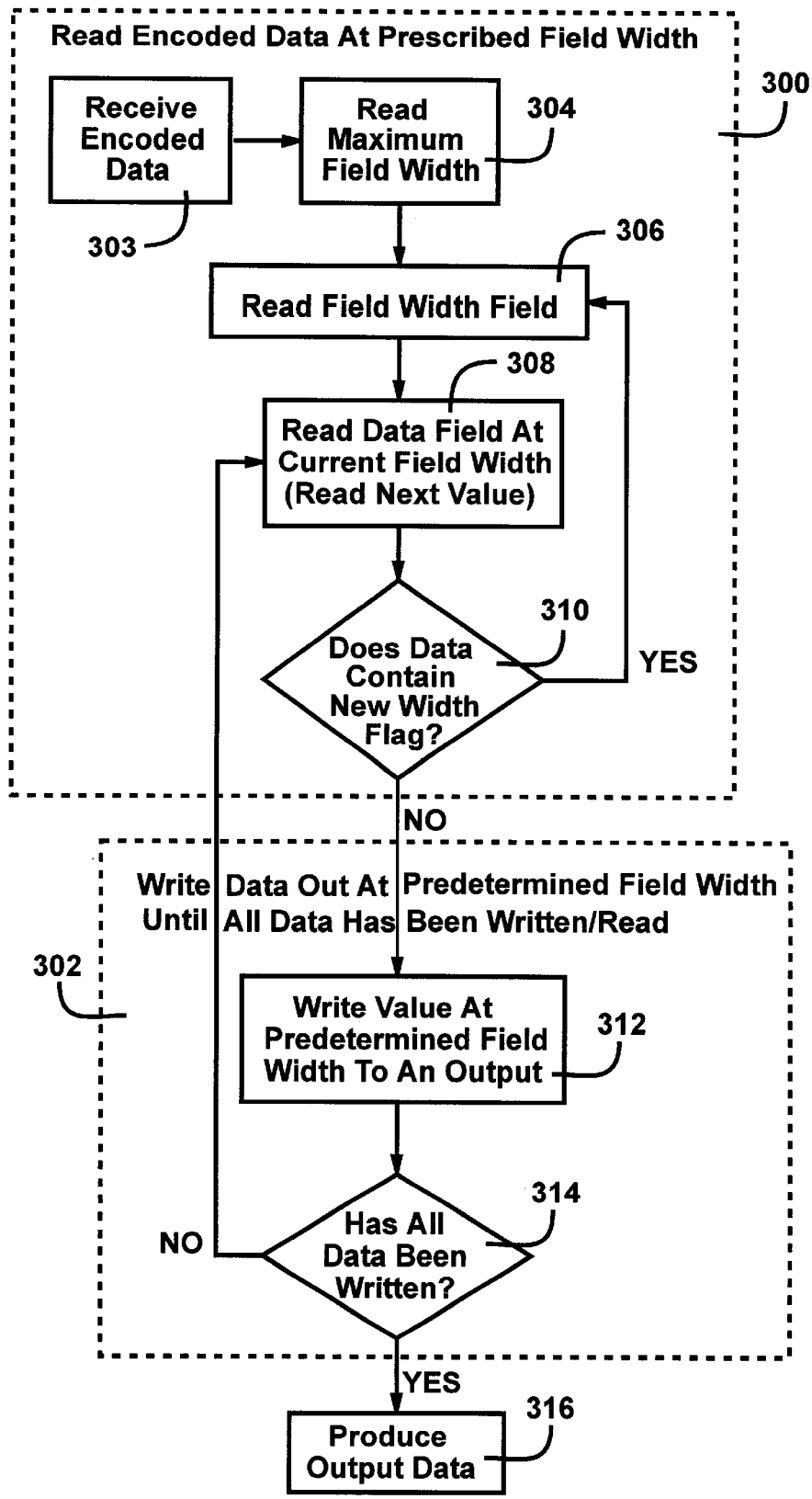
FIG. 3 is a flow diagram illustrating general operation of the decode processor of FIG. 1A.

Exemplary Decode Module:

FIG. 3 is a flow diagram illustrating general operation of the decode module of FIG. 1A. The decode module is for illustrative purposes and any suitable decode module, in accordance with the present invention, can be used. The decode module of the adaptive field processor 106 of FIG. 1A reads encoded data at prescribed field widths 300 and then writes out the data at maximum field widths until all data has been written/read 302. As a result, the decode module is simple and does not require inefficient stored or referenced symbol tables or encoding trees.

As shown in FIG. 3, first, the encoded data is received 303. Second, the maximum field width of the encoded data is read 304. Third, a first field width field is read 306. Fourth, a data field is read, i.e., a data field is read at the current field width 308. Fifth, it is determined whether the current data field contains a new width flag indicating a field width change 310 (if the flag used is an "all ones" flag, as discussed above, it is determined whether the current data field contains all ones). If it does, then the next field width field is read 306 and the next data field is read 308 until the current data field does not contain a new width flag indicating a field width change 310. If the data field does not contain a new width flag indicating a field width change 310, a value is written at a predetermined field width to an output 312. Next, it is determined whether all data has been written 314. If it has not, the next value is read 308 and all subsequent steps are performed as described above until all data has been written. After all data has been written, output data is produced 316 having a lossless representation of the input data.

Exemplary Computer Implemented Embodiment:

The adaptive field processor 106 of FIG. 1A can be implemented with suitable associating, tracking, evaluating and rendering components for determining an optimized encoding scheme in accordance with the present invention. These components can be computer software components, such as a linked list component for associating the input data stream with a modified decision tree component that tracks the data values, evaluates potential new field widths and sequences and implements an optimal encoded arrangement.

Although other suitable components can be used to accomplish an optimized encoding scheme, a linked list and a decision tree are discussed below for illustrative purposes only.

Figure 4A:
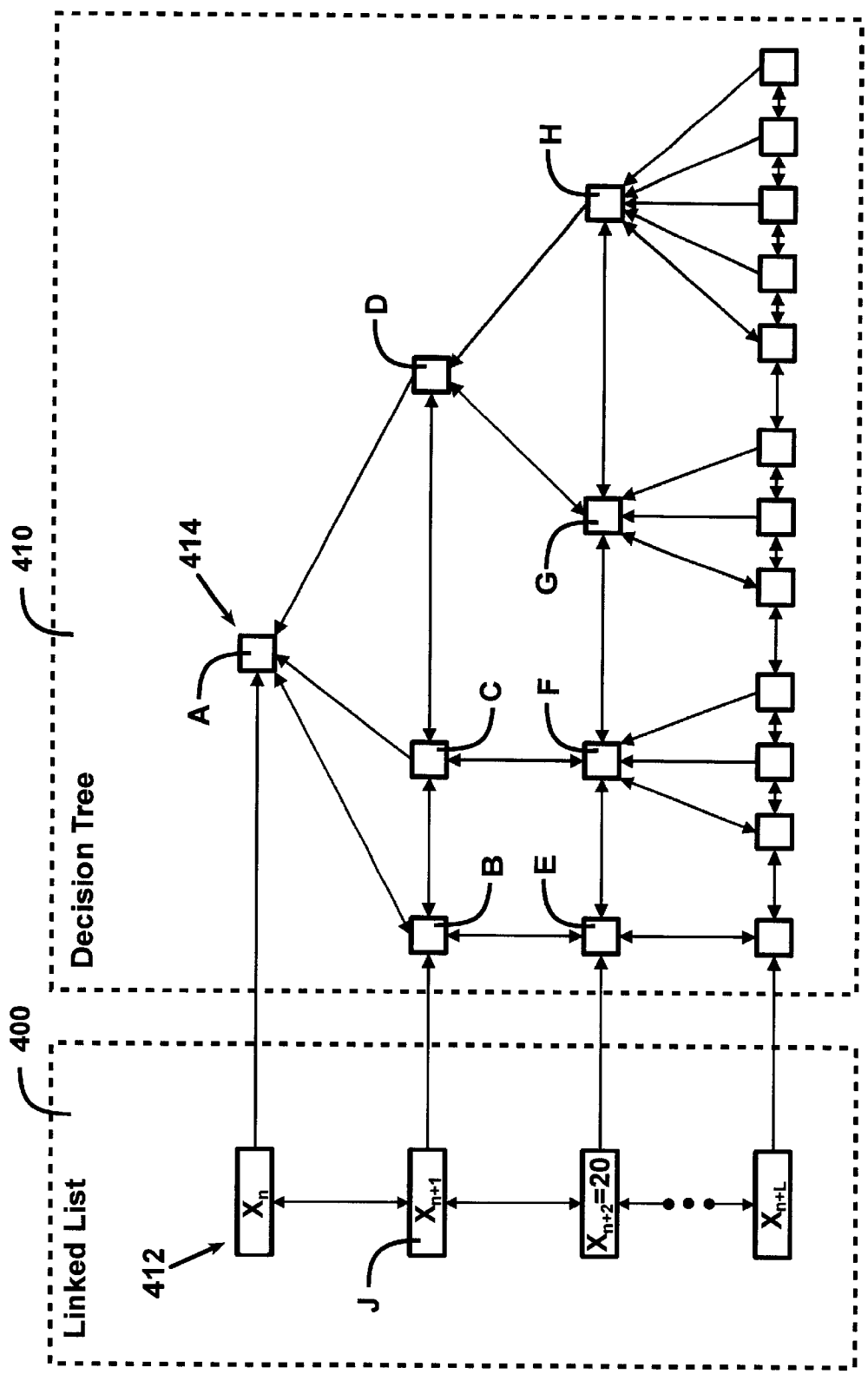
FIG. 4A is a detailed block diagram illustrating a decision tree component and a linked list component of the present invention.

FIG. 4A is a detailed block diagram illustrating associating, tracking, evaluating and rendering components in the form of, for example, a decision tree component and a linked list component. In general, the linked list component 400 traverses an incoming data stream and associates the incoming data stream with a decision tree component 410. The decision tree component 410 tracks field width changes for certain paths and determines optimal field width sequences for storing the incoming data as a data set.

The linked list component 400 includes a plurality of nodes 412 with corresponding levels, such as $X_n$, $X_{n+1}$, $X_{n+2}$, ..., $X_{n+L}$, and encoded input values corresponding to the input data, wherein each encoded input value corresponds to a value to be written at the particular level, where n is an initial level and L is the total number of encoded input values of the input data to be written at all levels, minus 1. The decision tree component 410 includes a plurality of nodes 414. The nodes 414 are comprised of parent nodes, children nodes, and sibling nodes. For instance, node A is the parent node of nodes B, C, and D, while nodes B, C, and D are sibling nodes of each other. Further, node B is the parent node of node E, node C is the parent node of node F, and node C is the parent node of nodes G and H, while nodes E, F, G and H are sibling nodes of each other. This pattern continues for subsequent children nodes.

The linked list 400 is coupled to the decision tree 410 and represents the values to be encoded and keeps track of tree levels during computation. Each input data value is represented in consecutive nodes in the linked list 400. As an example, if n=0 and if a linked list node has a level value of 2 and an input value of 20, this signifies that the 3rd value of the input data to be encoded has a value of 20. Also, each linked list node has pointers to the previous and next nodes in the linked list and to the leftmost node of the decision tree at the same level as itself.

Each node 414 in the decision tree 410 contains pointers (shown by arrowheads) to its parent node, left and right sibling nodes, and to cousin nodes so that consecutive nodes on the same linked list level have double pointers to each other. Also, each parent node contains a pointer to at least one of the child nodes, such as the leftmost child node. Additionally, each node has a fanout indicating the number of nodes that call this node their parent, a value representing the current bit field width at that particular point in the decision path, and the total number of bits required to represent the data if decisions are made down to this point in the tree.

Specifically, when each linked list node is created, it points to a node in the decision tree 410 representing the largest bit field width allowed to represent a value.

For example, linked list node J would point to decision tree node B. This tree node B then points right to tree node C representing a storage field width one bit less than node B, tree node C then points right to tree node D representing a storage field width one bit less than node C, and so on. This chain of tree nodes continues until the rightmost tree node contains the minimum field width required to represent the value in the list node.

All of these decision tree nodes are at the same level in the decision tree 410 and at the same level as the list node of the linked list 400. The parent decision tree node for all of these decision tree nodes is the leftmost node in the previous level in the decision tree 410. If there is more than one decision tree node in the previous linked list level, the string of decision tree nodes then continues. The field width starts again from the maximum allowed field width, and the parent decision tree node for the new decision tree nodes is the one to the right of the previous parent decision tree node. This continues until all decision tree nodes in the previous linked list level have decision tree child nodes for each field width between the maximum allowed field width and the minimum field width required to represent the data stored in the list node.

Figure 4B:
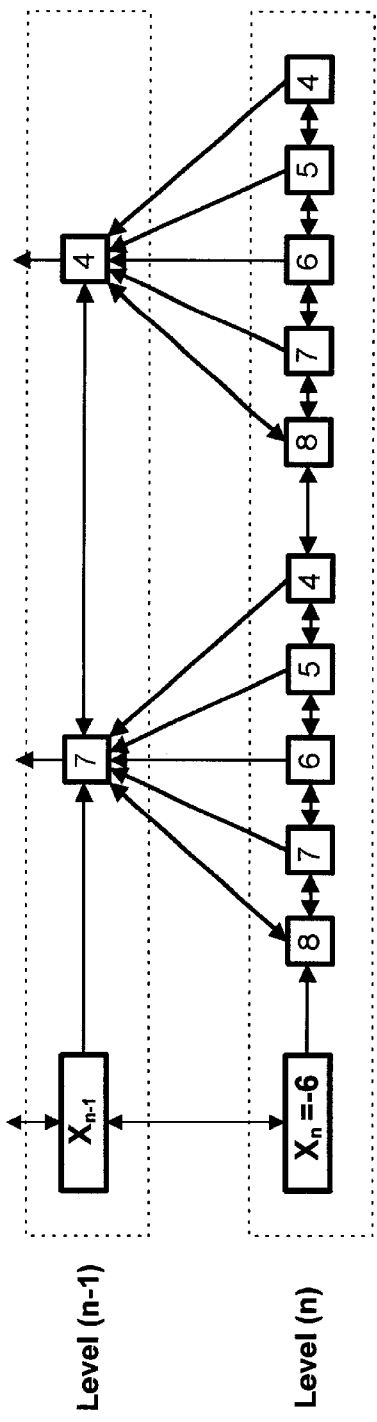
FIG. 4B is a detailed block diagram illustrating an insertion into the decision tree component and a linked list component of FIG. 4A.

FIG. 4B illustrates one example of decision tree insertion. The numbers in the decision tree nodes represent the field width decision for that point in the tree. The linked list 400 has X values representing input data values. It is assumed in FIG. 4B that the maximum bit field width allowed to represent a value is set at 8 bits (the maximum bit field width is set by the input data and can be set at any number) and linked list node at level n has an input data value of $X_n$=−6. The value −6 ranges from −6 to +6, which is a range of thirteen. Using the numeric value system ($2^{n\ bits}$=range), thirteen requires a minimum of 4 bits of storage ($2^{3\ bits}$=8 which is a range of 0 to 7 while $2^{4\ bits}$=16 is a range of 0 to 15). It is further assumed that parent decision nodes T and R of previous linked list level $X_{n-1}$ had two decision branches (level $X_{n-1}$ had more decisions nodes, but most were removed because their bit count was too high, as will be discussed in detail below). Since the maximum is set to 8 bits, there are 5 sibling branches for each parent node and their ranges are set from 8 bits to 4 bits, one for each possible field width decision.

The next step is to examine the decision tree nodes in the last level of the decision tree. If the cumulative bit count at any of the decision tree nodes is so large that further decisions from that point on will always use more bits than any of the other decision tree nodes, the high-bit-count node is removed. When a node is removed, the entire branch of nodes leading only to it are also removed. In other words, if it is an only child, its parent node is also removed. If the grandparent node only has one branch, it is also removed. This continues until a node with multiple branches is reached. Then the top decision tree node of the decision tree is checked to see if it has only one branch remaining. If it doesn't, it is still unclear which field width should be used to represent the current data value, as shown in FIG. 4A.

Figure 4C:
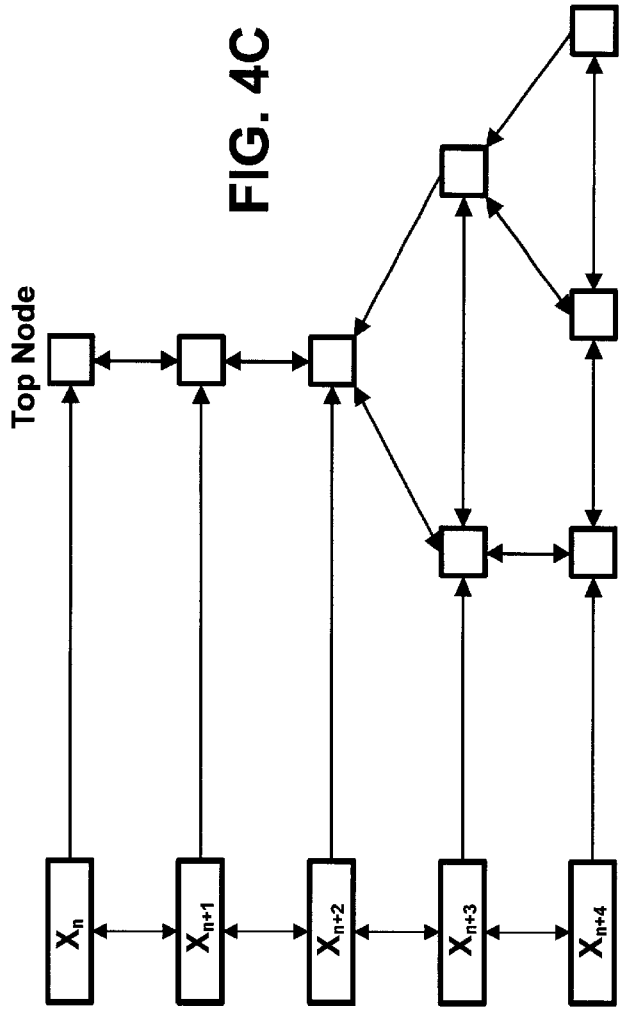
FIG. 4C is a detailed block diagram illustrating a partially resolved decision tree component and a linked list component of the present invention.

However, if it does have only one branch remaining, as shown in FIG. 4C, representing the value at a field width of that remaining branch results in the most compact representation to this point in the data stream, and the value is represented at that field width. The next decision tree node down then becomes the new top node of the decision tree, and the check repeats for this decision tree node. If the new top decision tree node has only one branch, the next data value is represented at a field width of that decision tree node.

This process repeats until the new top node of the decision tree has multiple branches. At this time, the decision tree will continue to grow from the bottom down, and branches will be added, compared and removed until the decision tree top node has only one branch left. Once the bottom of the decision tree is reached (i.e. all input data values have been represented in the linked list), all bottom decision tree nodes are compared, and the one with the lowest bit count is used to represent the remaining data.

Figure 5:
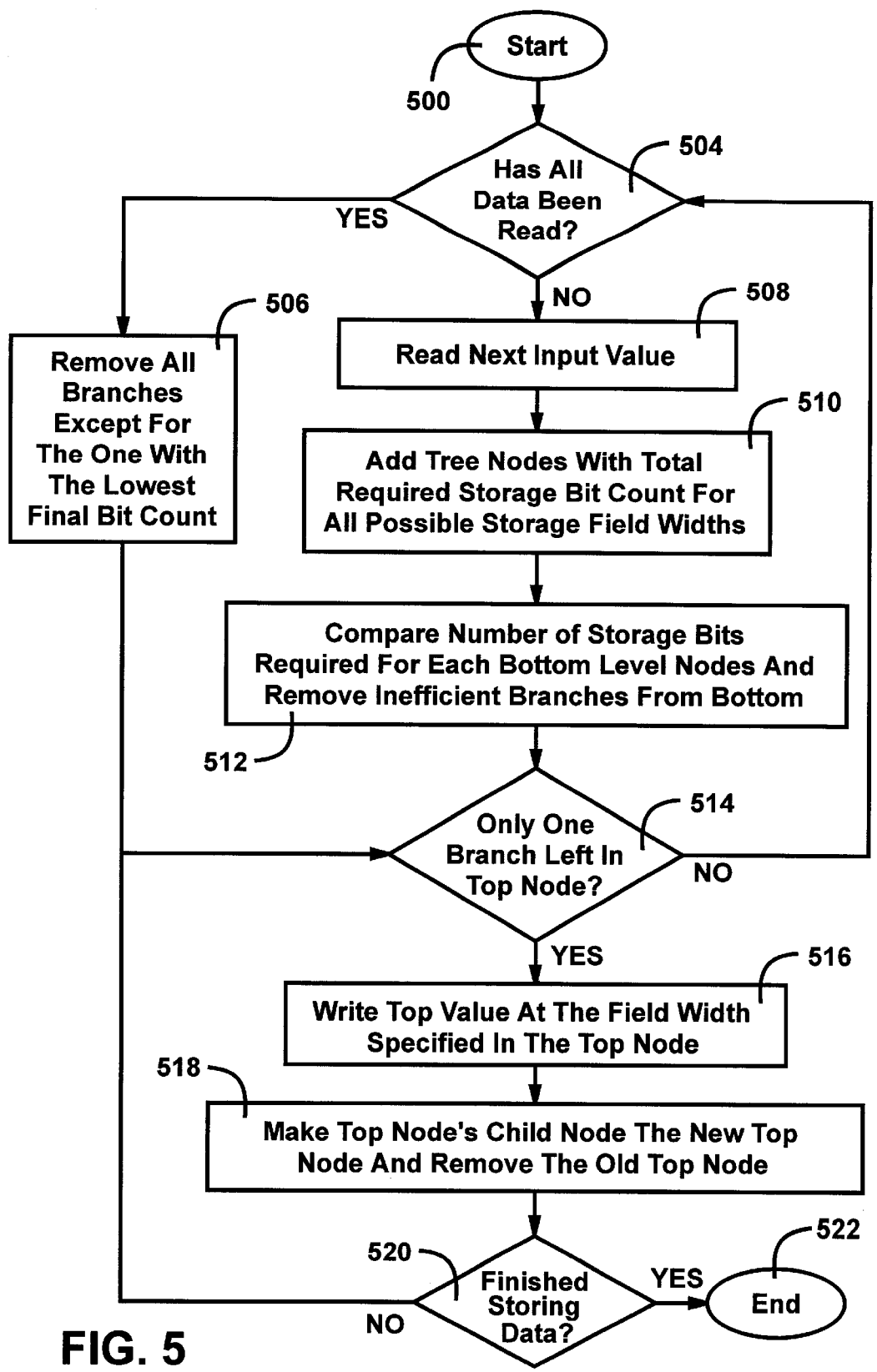
FIG. 5 is a flow diagram of a working example of the present invention of FIGS. 4A and 4B.

In addition, simple modifications can be made to the data compression system and method of the present invention to encode multi-threaded data sets, such as RGB file types. For instance, for a multi-threaded data set, each thread has its own decision tree, and encoded values from each thread are written out sequentially to preserve grouping of the data.
Working Example:

FIG. 5 is a flow diagram illustrating detailed steps of working example of FIGS. 4A, 4B, and 4C of the present invention. The following is a general overview of a working example that is shown for illustrative purposes only. First, the process starts 500 and second, it is determined whether all data has been read 504. If all data has been read, then all branches are removed, with the exception of the branch with the lowest final bit count 506. If not, the next input value is read 508, the decision tree nodes are then added with the total required representation bit count for all possible representation field widths 510, last, the bit representation numbers required for each bottom level node are compared and inefficient branches are removed 512. Next, after either all branches are removed, with the exception of the branch with the lowest final bit count, or after inefficient branches are removed, it is determined whether only one branch is left in the top node 514.

If more than one branch is left in the top node, then the process returns to the step of determining whether all data has been read 504. If only one branch is left in the top node, the top value is written at the field width specified in the top node 516, the child node of the old top node becomes the new top node and the old top node is removed 518, and then it is determined whether the process is finished representing data 520. If the process is finished representing data, the process ends 522. If the process is not finished representing data, the process returns to the step of determining whether only one branch is left in the top node 514.

A prefilter, such as a conventional delta encoder or the like can be used before encoding the data. The prefilter process low frequency data to produce small magnitudes on a large percentage of consecutive data elements, thereby requiring only a relatively small number of bits to be represented.
Sample Portion of Working Example:

For purposes of illustration, FIGS. 6A, 6B, 7A, and 7B show a sample portion of the working example of the present invention. This sample portion has been presented for the purposes of illustration and description only and is not intended to be exhaustive or to limit the invention to the precise form disclosed. In this example for a particular given input data, it is assumed that the maximum bit field width allowed to represent a value is set at 16 bits.

Figure 6A:
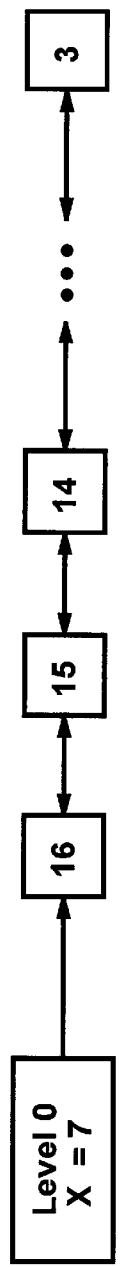
FIG. 6A is a detailed block diagram illustrating a first decision insertion into a decision tree of a sample portion of the working example of FIG. 5 of the present invention.

FIG. 6A is a detailed block diagram illustrating a sample first decision insertion into a decision tree of the working example of FIG. 5 of the present invention. A first value of the input data is read at a first linked list level n=0 of the linked list to be 7 ($X_0=7$) and a field width required to represent the first value is determined. From this, the first level of the decision tree is built. Since the maximum bit field width is given at 16 bits and the value 7 requires a minimum of 3 bits ($2^{3\ bits}=8$) for representation, the decision tree nodes of linked list level n=0 are set with values ranging from 16 to 3. This range of 16 bits to 3 bits is the possible range to represent data value 7 of the first level. Since only the first level has been built and no child nodes exist, there are no decision paths to be evaluated for representation of the values.

Figure 6B:
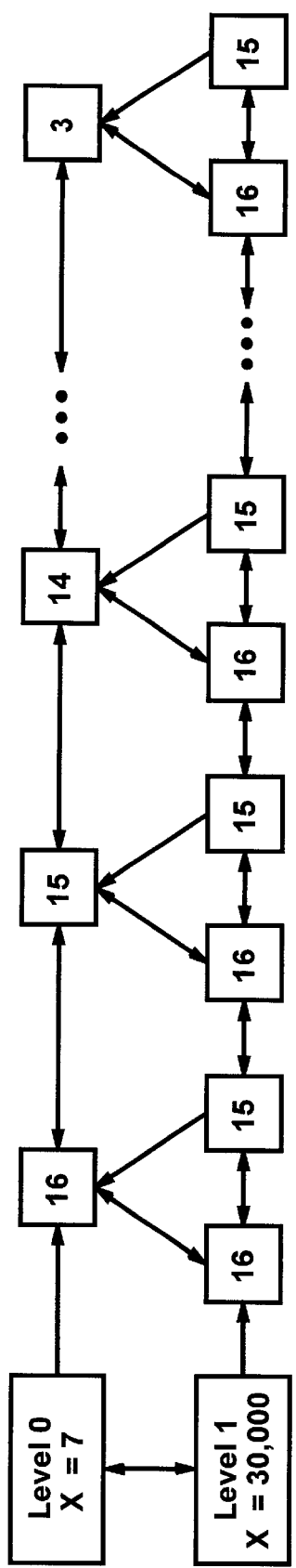
FIG. 6B is a detailed block diagram illustrating a second decision insertion into a decision tree of the sample of FIG. 6A.

The next value of the input data is then read and a field width required to represent this value is determined. From this, this next level of the decision tree is built. In this example, this next value is 30,000 so that $X_1=30,000$ at linked list level n=1. Since the maximum bit field width is given at 16 bits and the value X=30,000 requires a minimum of 15 bits ($2^{15\ bits}=32,768$ which is a range of 0 to 32,767) for representation, the decision tree nodes at this level are set with values ranging from 16 to 15 for each respective parent node at level 0, as shown in FIG. 6B. This range of 16 bits to 15 bits is the possible range to represent data value 30,000 at the second level.

Because more than one level has been created, numerous decision paths, namely 28 paths, can be evaluated before another value is read to dynamically determine the best possible representations for the first and second values. This dynamic process allows efficient encoding of the data for some data sets. Evaluation includes determining a cumulative bit count for each decision path and comparing the cumulative bit counts to determine the smallest bit count and excessively large bit counts. In other words, the bits required to represent the data for the entire range at these levels are compared for each decision path in the decision tree at these levels. If a cumulative bit count is excessively large so that further decisions from that point on will always use more bits than any of the other decision tree nodes, that particular decision path is removed.

The cumulative bit count is determined by calculating, in a given decision path, the number of bits required to represent the given data values, taking into account the maximum field width, required field width changes for a given decision path, and bit field widths to indicate the initial field width and field width changes. In this example, since the maximum field width was assumed to be 16 bits, the field width data will always be represented in fixed 4 bit field widths because it takes 4 bits to represent the value 16.

For instance, one decision path would be to represent the first value ($X_0=7$) at 15 bits and the second value ($X_1=30,000$) at 15 bits. This decision path has a cumulative bit count of 50 bits to represent the first two values. Namely, 16 bits to indicate the maximum field width of the data, added to 4 bits to indicate the first field width, added to 15 bits to represent the first value, added to 15 bits to represent the second value, for a total of 50 bits (16 bits+4 bits+15 bits+15 bits=50 bits). It should be noted that another 4 bits is not required to indicate the second field width, since subsequent field widths will always be assumed to be at the current field width. Thus, the 4 bit field is only required to indicate the initial field width and if there is a field width change.

Another decision path would be to represent the first value ($X_0=7$) at 16 bits and the second value ($X_1=30,000$) at 16 bits. This decision path has a cumulative bit count of 52 bits. It is important to note that these two decision paths do not require a field width change since in the first decision path discussed, the first value ($X_0=7$) is represented by a 15 bit field width and the second value ($X_1=30,000$) is also represented by a 15 bit field width. Likewise, in the second decision path discussed, the first value ($X_0=7$) is represented by a 16 bit field width and the second value ($X_1=30,000$) is also represented by a 16 bit field width.

However, the remaining decision paths in this example would require a field width change. For instance, field width changes occur for the decision path where the first value is represented at 16 bits and the second value at 15 bits, the decision path where the first value is represented at 15 bits and the second value at 16 bits, and so on. All of these possible decision paths would require a field width change. Since a field width change requires a bit representation flag to indicate that a field width change has occurred and a new field width must be read (as discussed above), additional overhead results.

For example, a decision path representing the first value at 16 bits and the second value at 15 bits would require a field width change and eventually would have a cumulative bit count of 71 bits. Namely, 16 bits to indicate the maximum field width, added to 4 bits to indicate the first field width, added to 31 bits (16 bits to store the first value and 15 bits to represent the second value) added to 20 bits to represent a change in field width.

The change in field width is calculated as follows. A field width change requires a new 4 bit field width field. The 4 bit field width indicates that, in the first level, the field width changed from 16 bits to 15 bits. The 4 bit field would represent a 15 bit field width. Also, this path would require a field (such as a field of all ones) with a field width at the current field width (in this case 16 bits) to make sure that the new field width is read. Thus, this path would require a total of 20 bits to change the field width (4 bits+16 bits), making the cumulative bit count 71, which is more than the 50 bit count for the decision path having the first value represented at 15 bits and the second value represented at 15 bits, as discussed above.

Although field width changes require additional bit representation, the cumulative bit count may still be less than a decision path without a field width change. For example, a decision path representing the first value at 3 bits and the second value at 15 bits would require a field width change and eventually would have a cumulative bit count of 45 bits. Namely, 16 bits to indicate the maximum field width, added to 4 bits to indicate the first field width, added to 18 bits (3 bits to store the first value and 15 bits to represent the second value) added to 7 bits to represent a change in field width. This cumulative bit count of 45, is less than the 50 bit count for the decision path having the first value represented at 15 bits and the second value represented at 15 bits, as discussed above.

After all the decision paths are evaluated, the decision path having the first value represented at 3 bits and the second value represented at 15 bits requires the least amount of bit representation (45 bits). Also, the decision path having the first value represented at 15 bits and the second value represented at 15 bits requires the second least amount of bit representation (50 bits), a relatively small amount. In addition, the decision path having the first value represented at 16 bits and the second value represented at 16 bits requires the third least amount of bit representation (52 bits), which is also a relatively small amount.

However, since the cumulative bit count for all other decision paths are excessively large, all other decision paths are removed. Decision paths requiring only relatively small amounts of bit representations are kept. When decision tree nodes are removed, the entire respective branches of these decision tree nodes leading to those particular decision tree nodes are also removed, as shown in FIG. 6C. FIG. 6C illustrates partially resolved components of FIG. 6A.

A next value of the input data is then read to be 40,000 so that $X_2$=40,000 at level n=2. Level 2 of the decision tree is created, as shown in FIG. 7A. Since the maximum bit field width is given at 16 bits and the value $X_2$=40,000 requires a minimum of 16 bits ($2^{16\ bits}$=65,536) for representation, the decision tree nodes at this level are set with values of 16 for each respective parent node at level 1, as shown in FIG. 7A. The entire range of bits to represent the data at this level is then compared for each decision node in the tree at this level.

The cumulative bit count is excessively large for the decision path with values of 3 for the first level, 15 for the second level, and 16 for the third level {3→15→16} (bit count of 80). Similarly, the cumulative bit count is excessively large for the decision path with values of 15 for the first level, 15 for the second level, and 16 for the third level {15→15→16} (bit count of 85).

This is because these two paths require a field width change for the third level while the decision path with values of 16 for the first level, 16 for the second level, and 16 for the third level does not {16→16→16} (bit count of only 68). Future decision paths of {3→15→16} and {15→15→16} will always use more bits than the decision path of {16→16→16}. Therefore, the decision nodes for decision paths of {3→15→16} and {15→15→16} are removed to leave only decision tree nodes for all levels with a value of 16. When these decision tree nodes are removed, the entire respective branches of these decision tree nodes leading to those particular decision tree nodes are also removed, as shown in FIG. 7C.

As a result, the decision tree is resolved for the first three levels (levels 0, 1, and 2). Further, since levels 0 and 1 are resolved and contain only one decision tree node, these nodes are removed so that the decision tree node of level 2 becomes the top node. The above process continues until all the input data values are read to produce encoded or compacted data. During the process, as illustrated above, representation of the entire set of the input data is dynamically optimized by comparing decision paths immediately and eliminating excessively large bit representations. Decoding the encoded data can be performed in accordance as shown in FIG. 3 and merely involves reading the encoded data at prescribed field widths and then writing out the data at a maximum field width until all the data has been written/read.

From the foregoing it will be appreciated that the data compression system and method of the present invention provides efficient encoding and decoding of data for some data sets. The data compression system and method provides an encoding scheme for dynamically compressing the data and a simple decoding scheme for decompressing the encoded data without the use of a stored or referenced symbol table or an encoding tree.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A data compression system for compressing data of an input data stream, the input data stream having field widths for holding data values of a data set, each field width being represented by a field value, the data compression system comprising an adaptive processor for encoding the input data stream by dynamically changing the field widths at various positions in the data stream, the adaptive processor including an encode module that dynamically indicates changes from longer to shorter and from shorter to longer field widths at the various positions using a width flag and one width information field.

2. The data compression system of claim 1, wherein each data value is represented by a width information field and each new width flag indicates field width changes and that a following field contains a width information field.

3. The data compression system of claim 2, wherein each new width flag is dynamically located to produce an optimal representation of the data set.

4. The data compression system of claim 1, wherein the adaptive processor further comprises an optimizer module for tracking the field widths and the data values of the input data stream, for evaluating potential new field widths at which each data value can be represented at, and for determining a minimum number of field values required to represent all of the data values of the data set.

5. The data compression system of claim 1, further comprising a prefilter for preconditioning low frequency data of the input data stream.

6. The data compression system of claim 1, wherein the adaptive processor further comprises a decode module for decoding the encoded input data stream and producing output data.

7. The data compression system of claim 6, wherein the output data is a lossless representation of the input data.

8. A data compression method for compressing data of an input data stream, the input data stream having field widths for holding data values of a data set, each field width being represented by a field value, the data compression method comprising encoding the input data stream by dynamically changing the field widths at various positions in the data stream, wherein encoding includes dynamically indicating changes from longer to shorter and from shorter to longer field widths at the various positions by using a width flag and at least one width information field.

9. The data compression method of claim 8, further comprising representing each data value by a width information field and indicating field width changes with each new width flag and that a following field contains a width information field.

10. The data compression method of claim 9, further comprising dynamically locating each new width flag to produce an optimal representation of the data set.

11. The data compression method of claim 8, further comprising tracking the field widths and the data values of the input data stream, evaluating potential new field widths at which each data value can be represented at, and determining a minimum number of field values required to represent all of the data values of the data set.

12. The data compression method of claim 8, further comprising preconditioning low frequency data of the input data stream.

13. The data compression method of claim 8, further comprising decoding the encoded input data stream to produce output data.

14. The data compression method of claim 13, wherein the output data is a lossless representation of the input data.

15. A computer-readable medium having computer-executable components for causing a computer to function as a data compression system for producing encoded data from input data stream, the input data stream having field widths for holding data values of a data set, each field width being represented by a field value, the data compression system comprising:
    a computer-readable storage medium; and
    a computer data compression system stored on said medium, said computer data compression system having an adaptive processor for dynamically changing the field widths at various positions in the data stream, the adaptive processor including an encode module that dynamically indicates changes from longer to shorter and from shorter to longer field widths at the various positions by using a width flag and at least one width information field.

16. The data compression system of claim 15, wherein each data value is represented by a width information field and each new width flag indicates field width changes and that a following field contains a width information field.

17. The data compression system of claim 16, wherein each new width flag is dynamically located to produce an optimal representation of the data set.

18. The data compression system of claim 15, wherein the adaptive processor further comprises an optimizer module for tracking the field widths and the data values of the input data stream, for evaluating potential new field widths at which each data value can be represented at, and for determining a minimum number of field values required to represent all of the data values of the data set.

19. The data compression system of claim 15, further comprising a prefilter for preconditioning low frequency data of the input data stream.

20. The data compression system of claim 15, wherein the adaptive processor further comprises a decode module for decoding the encoded input data stream and producing output data.

21. A computer-readable medium having computer-executable instructions for performing a method for compressing data of an input data stream having field widths for holding data values of a data set, each field width being represented by a field value, the method comprising:
    receiving the input data stream;
    sequentially reading and associating the data values;
    sequentially tracking the field widths and the data values;
    determining potential new field widths at which each sequentially received data value can be represented at;
    selecting a new field width sequence that optimally represents the data set by dynamically changing the field widths at various positions in the data stream by using a width flag and at least one width information field, the changes in width fields being from longer to shorter and from shorter to longer width fields; and
    representing the data with a new field width sequence as encoded data.

22. The method for compressing data of claim 21, further comprising preconditioning low frequency data of the input data stream.

23. The method of claim 21, further comprising decoding the encoded input data to produce output data as a lossless representation of the input data.

24. The method for compressing data of claim 21, wherein sequentially reading and associating the data values is performed by a linked list component and sequentially tracking the field widths and the data values and determining potential new field widths at which each sequentially received data value can be represented at is performed by a decision tree component.

25. A computer-readable memory device encoded with a data structure for compressing data of an input data stream having field widths for holding data values of a data set, each field width being represented by a field value, the data structure having entries each entry containing:
    a first parameter value corresponding to an input module for receiving the input data stream and sequentially reading and associating the data values;
    a second parameter value corresponding to a tracking module for sequentially tracking the field widths and the data values and an evaluation module for determining potential new field widths at which each sequentially received data value can be represented at and selecting a new field width sequence by dynamically changing the field widths at various positions in the data stream by using a width flag and at least one width information field, the changes in field widths being from longer to shorter and from shorter to longer field widths; and
    wherein the new field width sequence is in a compressed format that is an optimal representation of the data set.

26. The computer-readable memory device of claim 25, wherein the third parameter value further corresponding to noting each field width change.

27. The computer-readable memory device of claim 25, further comprising a fourth parameter value corresponding to a filter for preconditioning low frequency data of the input data stream.

28. The computer-readable memory device of claim 25, wherein the input module is a linked list component and the tracking and evaluation modules are a decision tree component.

29. The computer-readable memory device of claim 25, further comprising a decode module for receiving the compressed format to produce output data as a lossless representation of the input data.

30. The computer-readable memory device of claim 29, wherein the decode module reads the compressed format at prescribed field widths and writes information to the output data at maximum field widths until all data has been read and written.

31. A method of compressing data comprising:
receiving an input data, the input data including a plurality of data sets, each data set having a field width; and
compressing the input data by reducing the width field of each data set, wherein compressing includes:
selecting a minimum field width for each data set;
indicating a change in field width of a previous data set and a field width of a subsequent data set using a field width flag, the change in field width including a change from a longer to a shorter and from a shorter to a longer filed width; and
placing a field width information code after the flag to indicate the width field of the subsequent data set.

* * * * *

UNITED STATES PATENT AND TRADEMARK OFFICE
CERTIFICATE OF CORRECTION

PATENT NO.    : 6,225,922 B1                              Page 1 of 1
DATED         : May 1, 2001
INVENTOR(S)   : Kirkpatrick W. Norton It is certified that error appears in the above-identified patent and that said Letters Patent is hereby corrected as shown below:

<u>Column 16,</u>
Line 14, after "shorter to a longer", delete "filed" and insert in lieu thereof
-- field --.

Signed and Sealed this

Seventh Day of May, 2002

Attest:

Attesting Officer

JAMES E. ROGAN
*Director of the United States Patent and Trademark Office*